United States Patent
Ichinose et al.

(10) Patent No.: US 9,295,156 B2
(45) Date of Patent: Mar. 22, 2016

(54) WIRED CIRCUIT BOARD

(71) Applicant: NITTO DENKO CORPORATION, Osaka (JP)

(72) Inventors: Kouji Ichinose, Osaka (JP); Jun Ishii, Osaka (JP); Yoshito Fujimura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 17 days.

(21) Appl. No.: 14/283,612

(22) Filed: May 21, 2014

(65) Prior Publication Data

US 2014/0353007 A1 Dec. 4, 2014

(30) Foreign Application Priority Data

May 28, 2013 (JP) .................. 2013-112253

(51) Int. Cl.
*H05K 1/09* (2006.01)
*H05K 1/11* (2006.01)
*H05K 1/05* (2006.01)
*H05K 1/02* (2006.01)
(Continued)

(52) U.S. Cl.
CPC .............. *H05K 1/118* (2013.01); *H05K 1/0271* (2013.01); *H05K 1/05* (2013.01); *H05K 3/0082* (2013.01); *H05K 3/32* (2013.01); *H05K 2201/0394* (2013.01); *H05K 2201/09036* (2013.01); *H05K 2201/09845* (2013.01); *H05K 2201/2009* (2013.01); *H05K 2203/0285* (2013.01); *H05K 2203/308* (2013.01)

(58) Field of Classification Search
CPC ............. H05K 3/06; H05K 3/42; H05K 3/44; H05K 1/00; H05K 1/02; H05K 1/03; H05K 1/05; H05K 1/11; H05K 1/025; G11B 5/40; G11B 5/48; G11B 5/486
USPC ......... 174/251, 250, 255, 258, 260–262, 264; 361/746; 360/244.2, 245.8, 245.9; 216/17, 18, 20

See application file for complete search history.

(56) References Cited

U.S. PATENT DOCUMENTS

2003/0026078 A1* 2/2003 Komatsubara et al. ....... 361/746
2005/0122627 A1* 6/2005 Kanagawa et al. ........ 360/245.9

(Continued)

FOREIGN PATENT DOCUMENTS

JP 2007-537562 A 12/2007
WO 2005-114658 A2 12/2005

*Primary Examiner* — Xiaoliang Chen
(74) *Attorney, Agent, or Firm* — Jean C. Edwards, Esq.; Edwards Neils PLLC

(57) ABSTRACT

A wired circuit board includes a metal supporting layer, a first insulating layer, a conductive pattern, and a second insulating layer. The first and second insulating layers include first and second openings which expose both surfaces of the conductive pattern. The conductive pattern has the surface on the other side thereof in a thickness direction which is exposed through the first opening and configured as a first terminal portion, and the surface on one side thereof in the thickness direction which is exposed through the second opening and configured as a second terminal portion. The metal supporting layer includes a third opening which exposes the first terminal portion and a covering portion of the first insulating layer which covers the conductive pattern continued to the first terminal portion, and a reinforcing portion located on a surface on the other side of the covering portion in the thickness direction.

4 Claims, 7 Drawing Sheets

(51) Int. Cl.
*H05K 3/00* (2006.01)
*H05K 3/32* (2006.01)

(56) References Cited

U.S. PATENT DOCUMENTS

| | | | |
|---|---|---|---|
| 2008/0029293 A1* | 2/2008 | Ooyabu et al. | 174/250 |
| 2009/0151994 A1* | 6/2009 | Ohsawa et al. | 174/261 |
| 2009/0255717 A1* | 10/2009 | Mizushima et al. | 174/255 |
| 2009/0261060 A1* | 10/2009 | Mizushima et al. | 216/13 |
| 2012/0175151 A1* | 7/2012 | Mizutani | 174/250 |
| 2012/0224281 A1* | 9/2012 | Arai | 360/244.2 |
| 2013/0020112 A1* | 1/2013 | Ohsawa | 174/255 |
| 2013/0105208 A1* | 5/2013 | Higuchi et al. | 174/258 |
| 2013/0133939 A1* | 5/2013 | Ishii | 174/262 |
| 2013/0319743 A1* | 12/2013 | Ishii et al. | 174/260 |
| 2013/0319748 A1* | 12/2013 | Ishii et al. | 174/262 |

\* cited by examiner

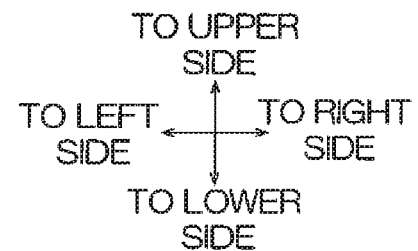
FIG. 3A
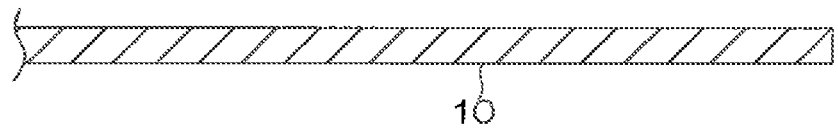
FIG. 3B
FIG. 3C
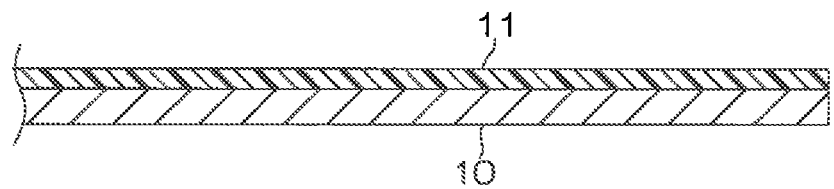
FIG. 3D
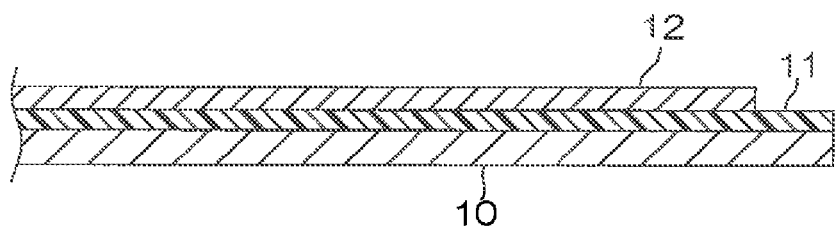
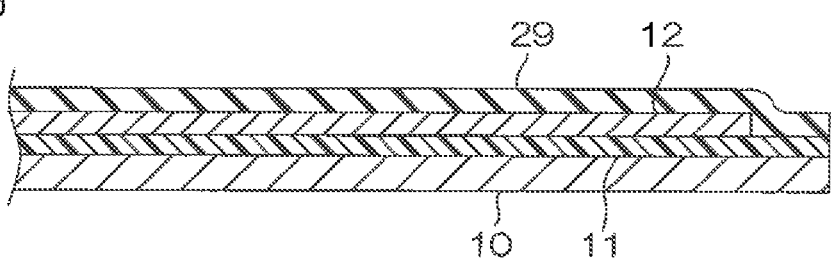

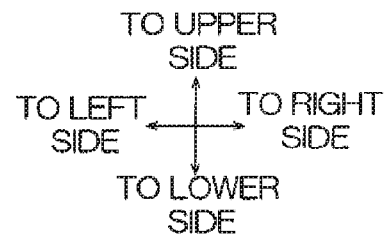
FIG. 4E
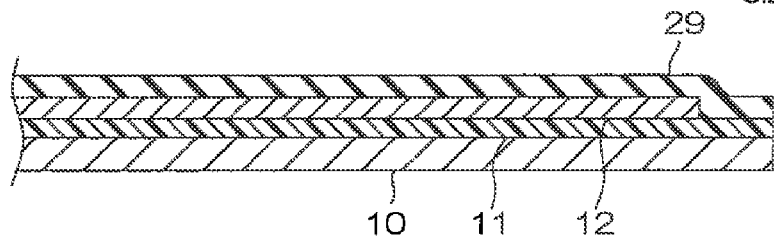
FIG. 4F
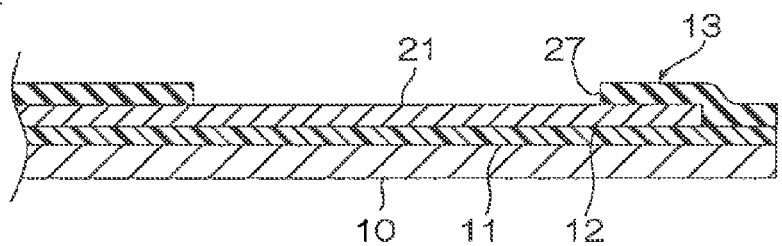
FIG. 4G
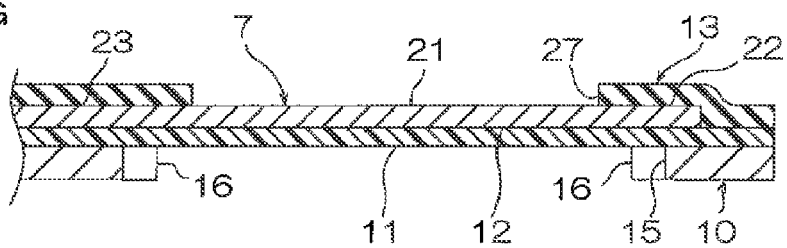
FIG. 4H
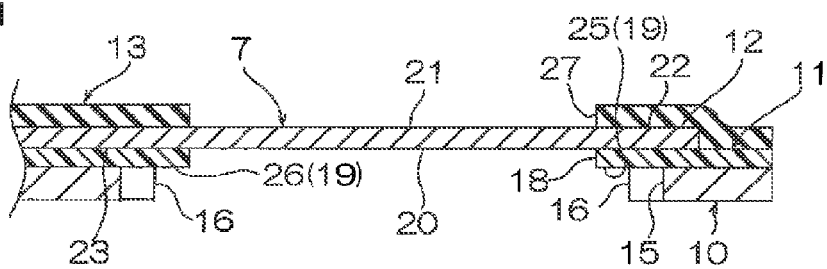
FIG. 4I
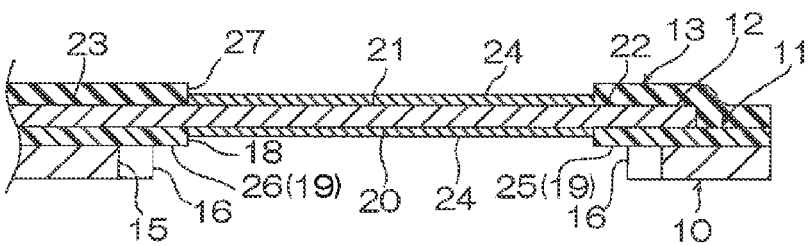

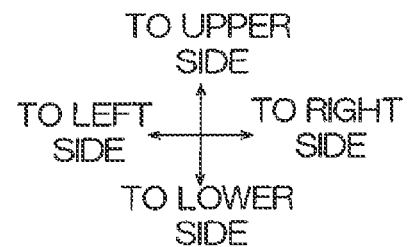
FIG. 6A
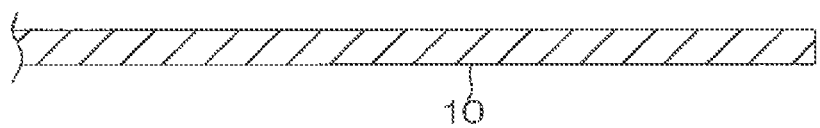
FIG. 6B
FIG. 6C
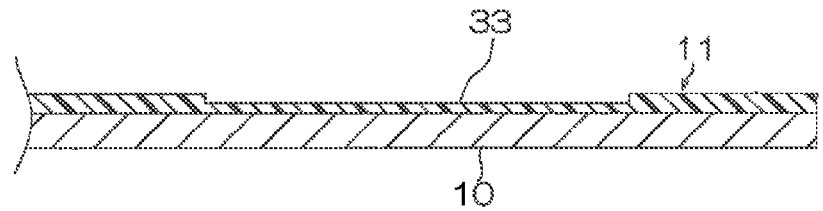
FIG. 6D
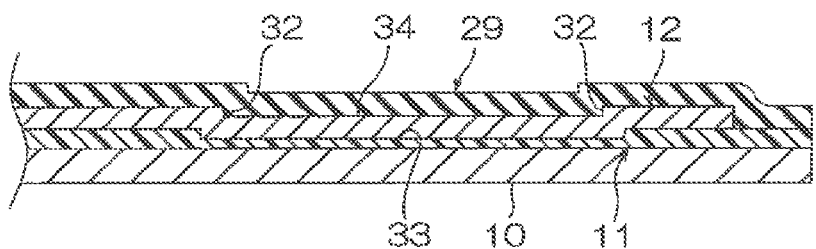

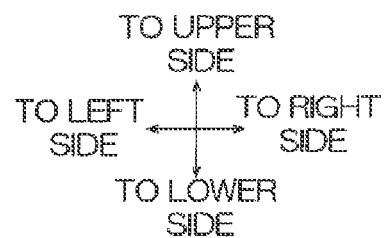
FIG. 7E
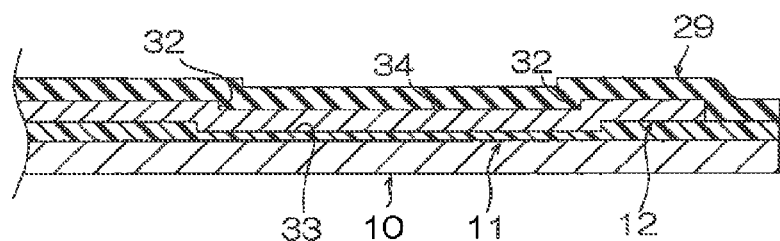
FIG. 7F
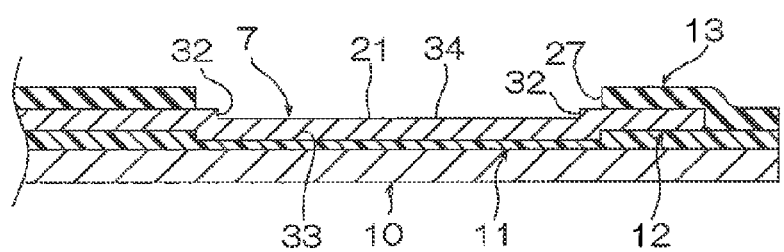
FIG. 7G
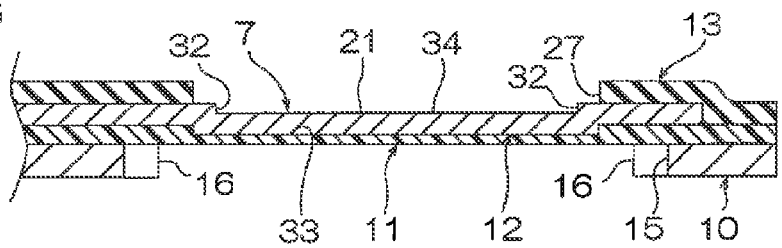
FIG. 7H
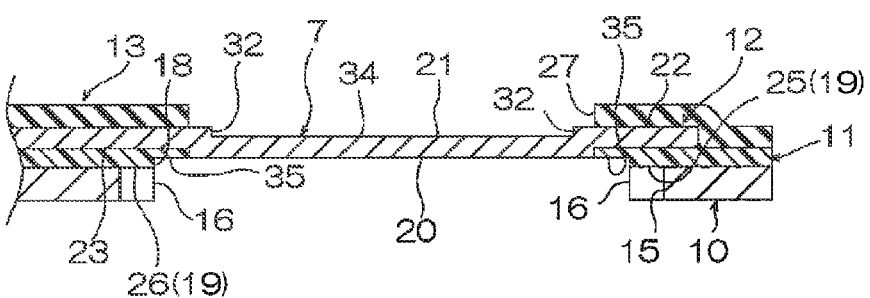

WIRED CIRCUIT BOARD

CROSS-REFERENCE TO RELATED APPLICATION

The present application claims priority from Japanese Patent Application No. 2013-112253 filed on May 28, 2013, the content of which is herein incorporated by reference into this application.

BACKGROUND OF THE INVENTION

1. Field of the Invention

The present invention relates to a wired circuit board, and particularly to a wired circuit board used preferably as a suspension board with circuit.

2. Description of the Related Art

A wired circuit board used for electronic/electric equipment or the like is typically formed with a terminal portion to be connected to an external terminal.

In recent years, to respond to the increase in the density of electronic/electric equipment and the reduction in the size thereof, a flying lead having a terminal portion formed not only on one surface of a conductive pattern, but also on each of the both surfaces of the conductive lead thereof has become prevalent. For example, it has been known that, in a suspension board with circuit used in a hard disk drive or the like, the both surfaces of a conductive lead are exposed to form a terminal portion as a flying lead. Such a terminal portion formed as a flying lead is bonded to an external terminal by, e.g., applying ultrasonic vibration thereto using an ultrasonic bonding device or the like.

The terminal portion formed as the flying lead is suited for bonding using ultrasonic vibration since the both surfaces of the conductive lead are exposed and an ultrasonic wave is readily transmitted thereto. However, the terminal portion formed as the flying lead has a problem in that the physical strength thereof is low and a stress is concentrated on an end portion of the terminal portion to easily cause a disconnection. To solve the problem, various suspension boards with circuits have been studied which allow the disconnection of the flying lead to be suppressed.

For example, a head suspension has been proposed in which a spring metal island is electrically and mechanically connected to a flying lead region where the both surfaces of a conductive lead are exposed to reinforce the conductive lead in the flying lead region (see, e.g., Published Japanese Translation of PCT Application No. 2007-537562).

SUMMARY OF THE INVENTION

In the head suspension described in Published Japanese Translation of PCT Application No. 2007-537562, the spring metal island is connected to the conductive lead in the flying lead region. This inhibits the transmission of the ultrasonic wave to the conductive lead in the flying lead region, and the bonding using ultrasonic vibration may be difficult.

On the other hand, when the output of the ultrasonic bonding device is increased, the conductive lead to which the spring metal island is connected and the external terminal can be bonded together using ultrasonic vibration. However, a problem arises in that the abrasion of a jig for the ultrasonic bonding device progresses.

It is therefore an object of the present invention to provide a wired circuit board which allows a first terminal portion or a second terminal portion and an external terminal to be reliably bonded together using ultrasonic vibration and allows the disconnection of a conductive pattern to be suppressed.

A wired circuit board of the present invention includes a metal supporting layer, a first insulating layer formed on a surface on one side of the metal supporting layer in a thickness direction thereof, a conductive pattern formed on a surface on one side of the first insulating layer in the thickness direction, and a second insulating layer formed on a surface on one side of the conductive pattern in the thickness direction. The first insulating layer includes a first opening which exposes a surface on the other side of the conductive pattern in the thickness direction from the first insulating layer. The second insulating layer includes a second opening which exposes the surface on one side of the conductive pattern in the thickness direction from the second insulating layer and is located such that at least one part thereof overlaps the first opening when projected in the thickness direction. The conductive pattern has the surface on the other side thereof in the thickness direction which is exposed through the first opening and configured as a first terminal portion, and the surface on one side thereof in the thickness direction which is exposed through the second opening and configured as a second terminal portion. The metal supporting layer includes a third opening which exposes the first terminal portion and a covering portion of the first insulating layer which covers the conductive pattern continued to the first terminal portion, and a reinforcing portion located on a surface on the other side of the covering portion in the thickness direction and provided continuously from the metal supporting layer.

In such a configuration, the conductive pattern has the first terminal portion exposed through the first opening and the second terminal portion exposed through the second opening, and the first terminal portion and the second terminal portion form a flying lead. Accordingly, in the case where, e.g., the first terminal portion or the second terminal portion and an external terminal are bonded together using ultrasonic vibration from an ultrasonic bonding device or the like, the first terminal portion or the second terminal portion and the external terminal can be bonded together without excessively increasing the output of the ultrasonic bonding device. That is, it is possible to suppress the abrasion of a jig for the ultrasonic bonding device and also reliably bond together the first terminal portion or the second terminal portion and the external terminal.

In addition, the third opening exposes the first terminal portion and the covering portion of the first insulating layer which covers the conductive pattern continued to the first terminal portion, while the reinforcing portion is located on the surface on the other side of the covering portion in the thickness direction.

Accordingly, the reinforcing portion can enhance the physical strength of the flying lead (conductive pattern) at the end edge portion of the first opening for the reinforcement thereof via the covering portion and reinforce the flying lead (conductive pattern). As a result, even when a stress is concentrated on the flying lead at the end edge portion of the first opening, it is possible to suppress the disconnection of the conductive pattern and consequently improve the connection reliability of the conductive pattern.

Therefore, it is possible to reliably bond together the first terminal portion or the second terminal portion and the external terminal using ultrasonic vibration without excessively increasing the output of the ultrasonic bonding device and suppress the disconnection of the flying lead (conductive pattern).

In the wired circuit board of the present invention, it is preferable that the reinforcing portion is a protruding portion which protrudes from an end edge of the third opening toward an interior of the third opening.

Even in such a simple configuration, the protruding portion can reliably reinforce the flying lead (conductive pattern) at the end edge portion of the first opening via the covering portion.

BRIEF DESCRIPTION OF THE DRAWINGS

FIGS. 3A to D are process views for illustrating a producing method of the suspension board with circuit shown in FIG. 1, which is a cross-sectional view along the line X-X shown in FIG. 2C, FIG. 3A showing the step of preparing a supporting board, FIG. 3B showing the step of forming an insulating base layer, FIG. 3C showing the step of forming a conductive pattern, and FIG. 3D showing the step of forming a cover coating;

FIGS. 4E to I are process views illustrating the producing method of the suspension board with circuit shown in FIG. 1, which is subsequent to FIGS. 3A to D, FIG. 4E showing the step of exposing the cover coating to light via a photomask, FIG. 4F showing the step of developing the cover coating to form an insulating cover layer in a predetermined pattern, FIG. 4G showing the step of forming a board-side opening in the supporting board, FIG. 4H showing the step of forming a base-side opening in the insulating base layer, and FIG. 4I showing the step of forming a plating layer over each of a first terminal portion and a second terminal portion;

FIGS. 6A to D are process views for illustrating a producing method of a suspension board with circuit as a fourth embodiment of the wired circuit board of the present invention, FIG. 6A showing the step of preparing a supporting board, FIG. 6B showing the step of forming an insulating base layer, FIG. 6C showing the step of forming a conductive pattern, and FIG. 6D showing the step of forming a cover coating; and FIGS. 7E to H are process views illustrating the producing method of the suspension board with circuit, which is subsequent to FIGS. 6A to D, FIG. 7E showing the step of exposing the cover coating to light via a photomask, FIG. 7F showing the step of developing the cover coating to form an insulating cover layer in a predetermined pattern, FIG. 7G showing the step of forming a board-side opening in the supporting board, and FIG. 7H showing the step of forming a base-side opening in the insulating base layer.

DETAILED DESCRIPTION OF THE INVENTION

Figure 1:
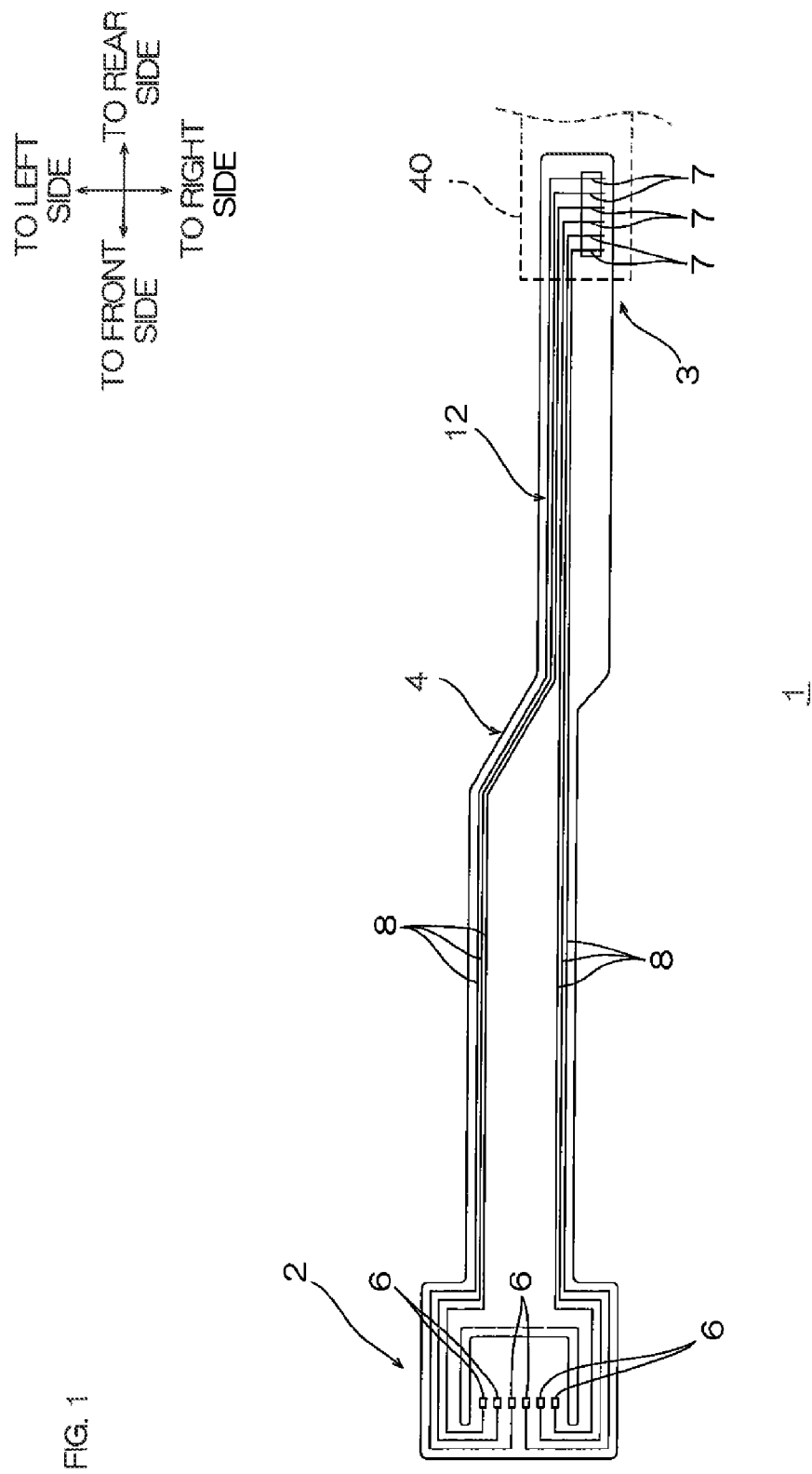
FIG. 1 is a plan view of a suspension board with circuit as a first embodiment of a wired circuit board of the present invention.

As shown in FIG. 1, a suspension board with circuit 1 as an example of a wired circuit board mounts thereon a magnetic head (not shown) in a hard disk drive to support the magnetic head, while holding a minute gap between the magnetic head and a magnetic disk, against an air flow when the magnetic head and the magnetic disk travel relatively to each other. The suspension board with circuit 1 is integrally formed with wires for connecting the magnetic head and a read/write board as an external circuit.

The suspension board with circuit 1 is formed in a generally rectangular flat belt shape in plan view which extends in a longitudinal direction. The suspension board with circuit 1 includes a slider mounting portion 2 which is disposed on one longitudinal side thereof and on which a slider (not shown) including the magnetic head (not shown) is mounted, an external connecting portion 3 which is disposed on the other longitudinal side thereof and electrically connected to a read/write board 40, and a wiring portion 4 extending in the longitudinal direction between the slider mounting portion 2 and the external connecting portion 3.

In the following description, it is assumed that, when a direction is mentioned, the side (left side in FIG. 1) on which the slider mounting portion 2 is provided corresponds to the front side of the suspension board with circuit 1 and the side (right side in FIG. 1) on which the external connecting portion 3 is provided corresponds to the rear side of the suspension board with circuit 1. Also, it is assumed that left/right sides are defined on the basis of those when the suspension board with circuit 1 is viewed from the front side, and therefore the upper side in FIG. 1 corresponds to the left side (one side in the widthwise direction) of the suspension board with circuit 1 and the lower side in FIG. 1 corresponds to the right side (the other side in the widthwise direction) of the suspension board with circuit 1. It is also assumed that, in FIG. 1, the front side in a depth direction corresponds to the upper side (one side in the thickness direction) of the suspension board with circuit 1 and the rear side in the depth direction corresponds to the lower side (the other side in the thickness direction) of the suspension board with circuit 1.

That is, it is assumed that the longitudinal direction of the suspension board with circuit 1 corresponds to a front-rear direction, the widthwise direction of the suspension board with circuit 1 corresponds to a lateral direction (a left-right direction), and the thickness direction of the suspension board with circuit 1 corresponds to a vertical direction (an up-down direction).

As shown in FIG. 4I, the suspension board with circuit 1 has a laminated structure. Specifically, a supporting board 10 as an example of a metal supporting layer, an insulating base layer 11 as an example of a first insulating layer, a conductive pattern 12, and an insulating cover layer 13 as an example of a second insulating layer are upwardly laminated in succession.

The supporting board 10 is formed of a metal material such as, e.g., stainless steel, a 42-alloy, aluminum, a copper-beryllium alloy, or phosphor bronze. Preferably, the supporting board 10 is formed of stainless steel. The supporting board 10 is formed in a generally rectangular flat plate shape in plan view which extends in the front-rear direction (see FIG. 1).

The supporting board 10 has a thickness in a range of, e.g., not less than 10 µm and, e.g., not more than 50 µm, or preferably not more than 25 µm.

Figure 2A:
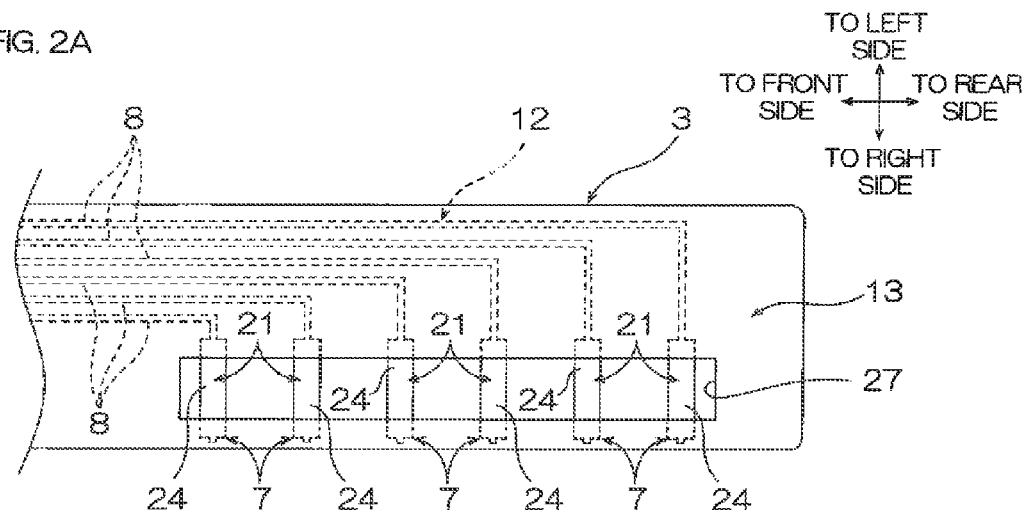
FIG. 2A is a plan view of the external connecting portion of the suspension board with circuit shown in FIG. 1.
Figure 2B:
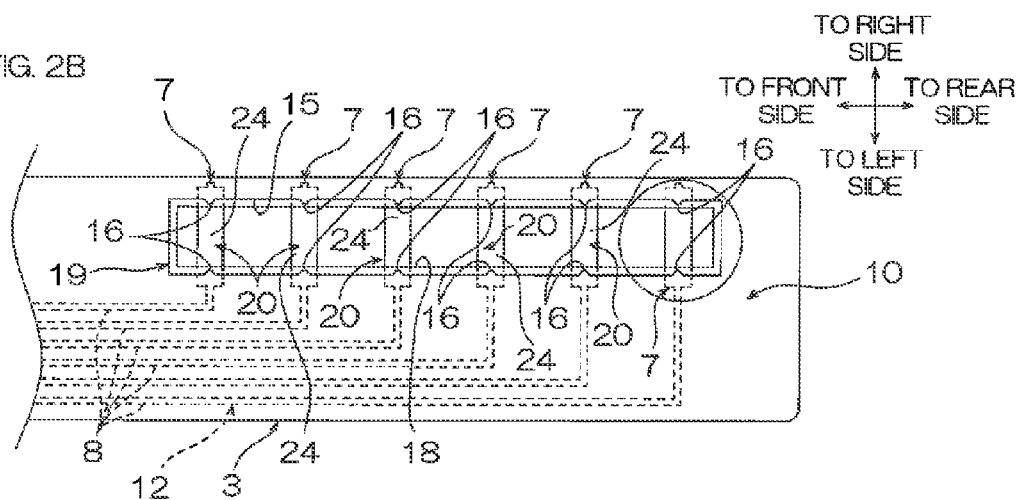
FIG. 2B is a bottom view of the external connecting portion of the suspension board with circuit shown in FIG. 2A.
Figure 2C:
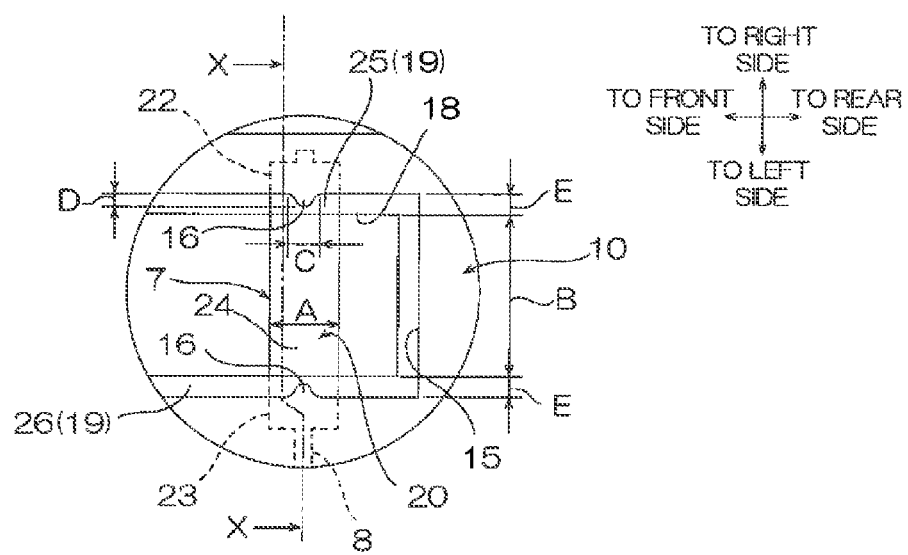
FIG. 2C is a bottom view of the external-side terminal shown in FIG. 2B, which is an enlarged view of the encircled portion in FIG. 2B.

As shown in FIGS. 2B and 2C, the supporting board 10 has a board-side opening 15 as an example of a third opening and protruding portions 16 as an example of a reinforcing portion in the portion thereof corresponding to the external connecting portion 3.

As shown in FIG. 2B, the board-side opening 15 is formed in the right-side portion of the rear end portion of the supporting board 10. The board-side opening 15 is formed in a generally rectangular shape in bottom view which extends in the front-rear direction and through the supporting board 10 in the vertical direction (see FIG. 4I).

The protruding portions 16 correspond to a plurality of external-side terminals 7 (described later). At each of both lateral end edges of the board-side opening 15, the plurality of protruding portions 16 are provided. Specifically, at each of the left and right end edges of the board-side opening 15, the plurality of (six) protruding portions 16 are arranged in parallel to be equally spaced apart from each other in the front-rear direction. The protruding portions 16 provided at the left end edge of the board-side opening 15 and the protruding portions 16 provided at the right end edge of the board-side opening 15 are located so as to correspond to each other when projected in the lateral direction.

That is, for each of the external-side terminals 7, one pair of the left and right protruding portions 16 are provided and the plurality of (six) pairs of protruding portions 16 are arranged in parallel to be equally spaced apart from each other in the front-rear direction.

Each of the paired protruding portions 16 is formed in a generally arc shape in bottom view which protrudes from the lateral end edge of the board-side opening 15 toward the interior of the board-side opening 15. That is, each of the protruding portions 16 is provided continuously from and integrally with the supporting board 10.

A longitudinal dimension C of the protruding portion 16 is in a range of, e.g., not less than 10 µm, or preferably not less than 30 µm and, e.g., not more than 200 µm, or preferably not more than 160 µm. A lateral dimension D of the protruding portion 16 is in a range of, e.g., not less than 3 µm, or preferably not less than 5 µm and, e.g., not more than 130 µm, or preferably not more than 70 µm.

Note that, in the present embodiment, all the protruding portions 16 are formed to have the same longitudinal dimensions C and the same lateral dimensions D.

As shown in FIG. 4I, the insulating base layer 11 is laminated on the upper surface of the supporting board 10 and formed in a predetermined pattern on the portion of the upper surface of the supporting board 10 where the conductive pattern 12 is formed. The insulating base layer 11 is formed of a synthetic resin such as, e.g., polyimide, polyamide imide, acryl, polyether nitrile, polyether sulfone, polyethylene terephthalate (PET), polyethylene naphthalate, or polyvinyl chloride. Preferably, in terms of dimensional stability against heat, the insulating base layer 11 is preferably formed of polyimide. The insulating base layer 11 has a thickness in a range of, e.g., 2 µm to 20 µm.

As shown in FIG. 2B, in the portion of the insulating base layer 11 corresponding to the board-side opening 15 of the supporting board 10, a base-side opening 18 as an example of a first opening is formed.

The base-side opening 18 is formed in a generally rectangular shape in bottom view which extends in the front-rear direction and through the insulating base layer 11 in the vertical direction (see FIG. 4I). Also, the base-side opening 18 is formed to have a longitudinal dimension and a lateral direction which are shorter than the longitudinal dimension and the lateral dimension of the board-side opening 15.

The base-side opening 18 is located such that the entire projection plane thereof is included in the board-side opening 15 when projected in the vertical direction. Accordingly, when the base-side opening 18 is projected in the vertical direction, between the peripheral end edge of the base-side opening 18 and the peripheral end edge of the board-side opening 15, a peripheral end portion 19 of the base-side opening 18 of the insulating base layer 11 (hereinafter referred to simply as the peripheral end portion 19) which is exposed from the board-side opening 15 is defined. That is, the peripheral end portion 19 of the base-side opening 18 is exposed to face downward through the board-side opening 15.

More specifically, the peripheral end portion 19 includes a right peripheral end portion 25 which is the right-side peripheral end portion, a left peripheral end portion 26 (which are an example of a covering portion) which is a left-side peripheral end portion, a front peripheral end portion which is a front-side peripheral end portion, and a rear peripheral end portion which is a read-side peripheral end portion.

As shown in FIG. 4I, the right peripheral end portion 25 and the left peripheral end portion 26 are each located over the individual protruding portions 16 to be adjacent thereto. That is, each of the protruding portions 16 is located on the lower surface of the corresponding right peripheral end portion 25 or left peripheral end portion 26.

As also shown in FIG. 2C, the respective ratios of lateral dimensions E of the right peripheral end portion 25 and the left peripheral end portion 26 to the lateral dimension D of the protruding portion 16 are in a range of, e.g., not less than 0.8, preferably not less than 1, more preferably not less than 2, and most preferably not less than 8 and, e.g., not more than 20, or preferably not more than 12.

When the respective ratios of the lateral dimensions E of the right peripheral end portion 25 and the left peripheral end portion 26 to the lateral dimension D of the protruding portion 16 are not less than the foregoing lower limit value, it is possible to prevent contact between first terminal portions 20 described later and the protruding portions 16. When the respective ratios of the lateral dimensions E of the right peripheral end portion 25 and the left peripheral end portion 26 to the lateral dimension D of the protruding portion 16 are not more than the foregoing upper limit value, it is possible to reliably ensure the exposed area of each of the first terminal portions 20 described later.

The lateral dimensions E of the right peripheral end portion 25 and the left peripheral end portion 26 are in a range of, e.g., not less than 50 µm, or preferably not less than 90 µm and, e.g., not more than 150 µm, or preferably not more than 110 µm.

Note that, in the present embodiment, the right peripheral end portions 25 and the left peripheral end portion 26 are formed to have the same lateral dimensions E.

As shown in FIG. 4I, the conductive pattern 12 is laminated on the upper surface of the insulating base layer 11 and formed of a conductive material such as, e.g., copper, nickel, gold, a solder, or an alloy thereof. Preferably, the conductive pattern 12 is formed of copper. The thickness of the conductive pattern 12 is in a range of, e.g., not less than 3 µm, or preferably not less than 5 µm and, e.g., not more than 30 µm, or preferably not more than 20 µm.

The conductive pattern 12 is formed as a predetermined wired circuit pattern on the upper surface of the insulating base layer 11. Specifically, as shown in FIG. 1, the conductive pattern 12 includes a plurality of (six) head-side terminals 6, the plurality of (six) external-side terminals 7, and a plurality of (six) wires 8.

The plurality of head-side terminals 6 are arranged in parallel in the slider mounting portion 2 to be equally spaced apart from each other in the lateral direction. The head-side terminals 6 are each formed in a generally rectangular shape (quadrilateral land) in plan view. The head-side terminals 6 are electrically connected to the magnetic head (not shown) of the slider (not shown).

As shown in FIG. 2A, the plurality of external-side terminals 7 are arranged in parallel in the external connecting portion 9 to be spaced apart from each other in the front-rear direction. As shown in FIG. 2C, the external-side terminals 7 are each formed in a generally rectangular shape (quadrilateral land) in plan view.

The ratio of a longitudinal dimension A (width) of the external-side terminal 7 (first terminal portion 20 (described later)) to the longitudinal dimension C of the protruding portion 16 is in a range of, e.g., not less than 0.8, or preferably not less than 1 and, e.g., not more than 5, preferably 5, or more preferably not more than 3.

When the ratio of the longitudinal dimension A (width) of the external-side terminal 7 is not less than the foregoing lower limit value, it is possible to increase the area of the first terminal portion 20 (described later). When the ratio of the longitudinal dimension A (width) of the external-side terminal 7 is not more than the foregoing upper limit value, the conductive pattern 12 at the lateral end edge portions of the base-side opening 18 is reliably reinforced by the protruding portions 16.

The longitudinal dimension A (width) of the external-side terminal 7 is in a range of, e.g., not less than 80 μm, or preferably not less than 140 μm and, e.g., not more than 300 μm, or preferably not more than 250 μm.

The ratio of a lateral dimension B of the first terminal portion 20 (described later) to the lateral dimension D of the protruding portion 16 is in a range of, e.g., not less than 5, preferably not less than 8, or more preferably not less than 10 and, e.g., not more than 200, preferably not more than 60, or more preferably not more than 30.

When the ratio of the lateral dimension B of the first terminal portion 20 (described later) is not less than the foregoing lower limit value, it is possible to increase the area of the first terminal portion 20 (described later). When the ratio of the lateral dimension B of the first terminal portion 20 (described later) is not more than the foregoing upper limit value, the conductive pattern 12 at the lateral end edge portions of the base-side opening 18 is reliably reinforced by the protruding portions 16.

The lateral dimension B of the first terminal portion 20 (described later) is in a range of, e.g., not less than 300 μm, or preferably not less than 460 μm and, e.g., not more than 2000 μm, or preferably not more than 1000 μm.

As shown in FIG. 2B, the spacing between the plurality of external-side terminals 7 is set such that the ratio thereof to the longitudinal dimension A of each of the external-side terminals 7 is in a range of, e.g., not less than 0.8, or preferably not less than 1 and, e.g., not more than 4, or preferably not more than 3.

When the ratio of the spacing between the plurality of external-side terminals 7 is not less than the foregoing lower limit value, a short circuit between the external-side terminals 7 adjacent to each other can be suppressed. When the ratio of the spacing between the plurality of external-side terminals 7 is not more than the foregoing upper limit value, an improvement can be achieved in the reliability of the connection between the first terminal portions 20 of the external-side terminals 7 and external terminals (not shown).

Each of the external-side terminals 7 is disposed so as to laterally traverse the base-side opening 18 when viewed from below and overlap the corresponding pair of protruding portions 16. In addition, the longitudinal middle portion of each of the external-side terminals 7 and the longitudinal middle portions of the corresponding pair of protruding portions 16 generally correspond to each other in the vertical direction.

As a result, the widthwise generally middle portions of the external-side terminals 7 are exposed to face downward through the board-side opening 15 and the base-side opening 18 and configured as the first terminal portions 20 to be connected to the external terminals (not shown). That is, the board-side opening 15 exposes the lower sides of the first terminal portions 20 and the peripheral end portion 19 of the base-side opening 18 in the insulating base layer 11, while the base-side opening 18 exposes the first terminal portions 20 from the insulating base layer 11.

As shown in FIG. 2A, the widthwise generally middle portions of the upper surfaces of the external-side terminals 7 are exposed to face upward through a cover-side opening 27 (described later) and configured as second terminal portions 21 to be connected to the external terminals (not shown).

That is, the lateral middle portion of each of the external-side terminals 7 has the lower surface (first terminal portion 20) thereof exposed from the board-side opening 15 and the base-side opening 18 and the upper surface (second terminal portion 21) thereof exposed from the cover-side opening 27 (described later) and is configured as a flying lead.

Note that, when viewed from below, a left end portion 23 of each of the external-side terminals 7 is covered with the left peripheral end portion 26 of the base-side opening 18 in the insulating base layer 11 and the left peripheral end portion of the board-side opening 15 in the supporting board 10. On the other hand, when viewed from below, a right end portion 22 of each of the external-side terminals 7 is covered with the right peripheral end portion 25 of the base-side opening 18 in the insulating base layer 11 and the right peripheral end portion of the board-side opening 15 in the supporting board 10.

As also shown in FIG. 4I, on the lateral middle portion of each of the external-side terminals 7 (the first terminal portion 20, the second terminal portion 21, and the both surfaces of the external-side terminal 7 continued thereto), plating layers 24 are provided.

Each of the plating layers 24 is formed of, e.g., nickel, gold, or the like and has a thickness in a range of, e.g., not less than 0.05 μm, or preferably not less than 0.1 μm and, e.g., not more than 5 μm, or preferably not more than 3 μm. The plating layer 24 may also be formed of one plating layer or a plurality of laminated plating layers.

As shown in FIG. 1, the first terminal portions 20 or the second terminal portions 21 are electrically connected to the external terminals (not shown) of the read/write board 40.

The plurality of wires 8 are provided so as to connect the plurality of head-side terminals 6 and the plurality of external-side terminals 7. Specifically, in the wiring portion 4, the plurality of wires 8 are arranged in parallel to be laterally spaced apart from each other and formed so as to extend in the front-rear direction. In the slider mounting portion 2, the wires 8 outwardly protrude on both sides in the lateral direction, extend frontwardly, and then inwardly extend in the lateral direction to be turned rearwardly so that the rear end portions thereof are connected to the front end portions of the head-side terminals 6. In the external connecting portion 3, after the wires 8 are bent rightwardly, the right end portions thereof are connected to the left end portions 23 of the external-side terminals 7 (see FIGS. 2B and 2C). Note that the wires 8 are formed to have widths smaller than those of the head-side terminals 6 and the external-side terminals 7.

As shown in FIG. 4I, the insulating cover layer 13 is laminated on the upper surface of the insulating base layer 11 so as to cover the conductive pattern 12 from above.

The insulating cover layer 13 is formed of the same synthetic resin as used to form the insulating base layer 11. Preferably, the insulating cover layer 13 is formed of polyimide. The thickness of the insulating cover layer 13 is in a range of, e.g., 2 μm to 20 μm.

The insulating cover layer 13 is also formed with a head-side-terminal exposing opening (not shown) which exposes the upper surfaces of the head-side terminals 6 and with the cover-side opening 27 as an example of a second opening which exposes the second terminals portions 21, i.e., upper surfaces of the external-side terminals 7.

The cover-side opening 27 is formed in the generally same shape and size as those of the base-side opening 18 in the right-side portion of the rear end portion of the insulating cover layer 13 to vertically extend therethrough so as to correspond to the base-side opening 18 when projected in the vertical direction.

Thus, the insulating cover layer 13 is formed on the upper surfaces of the wires 8 of the conductive pattern 12 to expose each of the plurality of head-side terminals 6 and the plurality of external-side terminals 7 (second terminal portions 21).

Next, a producing method of the suspension board with circuit 1 is described with reference to FIGS. 3A to 4I.

In the producing method of the suspension board with circuit 1, as shown in FIG. 3A, the supporting board 10 is prepared first.

Then, as shown in FIG. 3B, on the upper surface of the supporting board 10, the insulating base layer 11 is formed in a predetermined pattern.

To form the insulating base layer 11 on the upper surface of the supporting board 10, e.g., a solution (varnish) of a photosensitive synthetic resin as the material of the insulating base layer 11 is applied to the upper surface of the supporting board 10 and dried to form a photosensitive base coating. Then, the photosensitive base coating is exposed to light via a photomask not shown. The photomask includes a light shielding portion and a light full transmitting portion in a pattern. The light full transmitting portion is caused to face the portion of the base coating in which the insulating base layer 11 is formed, while the light shielding portion is caused to face the portion of the base coating in which the insulating base layer 11 is not formed. Then, the exposed base coating is developed and cured by heating.

Thus, the insulating base layer 11 is formed in the predetermined pattern on the upper surface of the supporting board 10.

Then, on the upper surface of the insulating base layer 11, as shown in FIG. 3C, the conductive pattern 12 is formed.

To form the conductive pattern 12 on the upper surface of the insulating base layer 11, the conductive pattern 12 may be formed appropriately by a known patterning method such as, e.g., a subtractive method or an additive method. Preferably, the additive method is used.

Thus, on the upper surface of the insulating base layer 11, the conductive pattern 12 including the plurality of head-side terminals 6, the plurality of external-side terminals 7, and the plurality of wires 8 is formed (see FIG. 1).

Note that, in terms of suppressing diffusion into the insulating cover layer 13, the conductive pattern 12 is preferably covered with plating (e.g., nickel plating). To thus cover the conductive pattern 12 with plating, e.g., either an electrolytic plating method or an electroless plating method may be used. Preferably, electroless plating is used.

Then, as shown in FIG. 4F, the insulating cover layer 13 having the cover-side opening 27 and the head-side-terminal exposing opening (not shown) is formed on the upper surface of the insulating base layer 11.

To thus form the insulating cover layer 13 on the upper surface of the insulating base layer 11, first, as shown in, e.g., FIG. 3D, a photosensitive synthetic resin (varnish) as the material of the insulating cover layer 13 is applied to the upper surface of the insulating base layer 11 including the conductive pattern 12 and dried to form a photosensitive cover coating 29.

Then, as shown in FIG. 4E, a photomask (not shown) is placed so as to downwardly face the respective portions of the cover coating 29 in which the cover-side opening 27 is formed and in which the head-side-terminal exposing opening (not shown) is formed to be spaced apart therefrom.

Thereafter, the photosensitive cover coating 29 is exposed to light via the photomask (not shown), developed, and then cured by heating.

Thus, as shown in FIG. 4F, the insulating cover layer 13 having the head-side-terminal exposing opening (not shown) and the cover-side opening 27 is formed on the upper surface of the insulating base layer 11.

As a result, the second terminal portions 21 of the external-side terminals 7 of the conductive pattern 12 are exposed to face upward through the cover-side opening 27 of the insulating cover layer 13 and the head-side terminals 6 of the conductive pattern 12 are exposed to face upward through the head-side-terminal exposing opening (not shown). On the other hand, the plurality of wires 8 of the conductive pattern 12 are covered with the insulating cover layer 13.

Next, as shown in FIG. 4G, the supporting board 10 is partially removed to be formed with the board-side opening 15 and the plurality of protruding portions 16.

To form the board-side opening 15 and the plurality of protruding portions 16, e.g., an etching method such as dry etching (e.g., plasma etching) or wet etching (e.g., chemical etching), drilling perforation, laser processing, or the like is used. Preferably, wet etching is used.

As a result, the supporting board 10 is formed with the board-side opening 15 and the plurality of protruding portions 16.

Then, on the lower surface of the insulating base layer 11 exposed through the board-side opening 15, an etching resist (not shown) is formed. When viewed from below, the etching resist (not shown) is disposed along the end edges of the board-side opening 15 and the plurality of protruding portions 16 so as to surround the portion in which the base-side opening 18 is formed along the peripheral end edge of the base-side opening 18 of the insulating base layer 11.

Next, as shown in FIG. 4H, the insulating base layer 11 (portion thereof in which the base-side opening 18 is formed) exposed from the etching resist (not shown) is removed by the foregoing etching method such as, e.g., wet etching (e.g., chemical etching). Thereafter, the etching resist (not shown) is removed.

Note that, in the wet etching, each of the supporting board 10 and the etching resist (not shown) masks the portion of the insulating base layer 11 other than the portion thereof in which the base-side opening 18 is formed to prevent the unintended portion of the insulating base layer 11 (peripheral end portion 19 of the base-side opening 18) from being etched.

In this manner, the base-side opening 18 is formed in the insulating base layer 11 so that the first terminal portions 20 of the external-side terminals 7 of the conductive pattern 12 are exposed to face downward through the base-side opening 18. Also, the peripheral end portion 19 of the base-side opening 18 of the insulating base layer 11 is exposed to face downward through the board-side opening 15.

Then, as shown in FIG. 4I, the plating layers 24 are respectively formed on the first terminals portions 20 and the second terminal portions 21 of the external-side terminals 7.

To form the plating layers 24, either an electrolytic plating method or an electroless plating method may be used. Preferably, electrolytic plating is used.

In this manner, on the respective surfaces of the first terminal portions 20 and the second terminal portions 21, the plating layers 24 are formed.

Thus, the production of the suspension board with circuit 1 is completed.

In the suspension board with circuit 1, the conductive pattern 12 has the first terminal portions 20 exposed through the base-side opening 18 and the second terminal portions 21 exposed through the cover-side opening 27. The first terminal portions 20 and the second terminal portions 21 form the flying leads. Accordingly, when the first terminal portions 20 or the second terminal portions 21 and the external terminals (not shown) of the read/write board 40 are bonded together using ultrasonic vibration from, e.g., a known ultrasonic bonding device or the like, it is possible to bond together the first terminal portions 20 or the second terminal portions 21 and the external terminals (not shown) without excessively increasing the output of the ultrasonic bonding device.

More specifically, the ultrasonic bonding device has an oscillation frequency in a range of, e.g., not less than 40 kHz, or preferably not less than 60 kHz and, e.g., not more than 100 kHz, or preferably not more than 70 kHz, a maximum amplitude in a range of, e.g., not less than 0.2 μm, or preferably not less than 0.5 μm and, e.g., not more than 3 μm, or preferably not more than 2 μm, and a rated output in a range of, e.g., not less than 1 W, or preferably not less than 2 W and, e.g., not more than 5 W, or preferably not more than 3.5 W.

Bonding conditions include a pressing load in a range of, e.g., not less than 0.5 N, or preferably not less than 1 N and, e.g., not more than 3 N, or preferably not more than 2 N and a vibration time in a range of, e.g., not less than 100 msec, or preferably not less than 200 msec and, e.g., not more than 600 msec, or preferably not more than 400 msec.

The board-side opening 15 exposes the first terminal portions 20 and the left peripheral end portion 26 of the base-side opening 18 covering the left end portions 23 of the external-side terminals 7 continued to the first terminal portions 20, while the protruding portions 16 are arranged on the lower surface of the left peripheral end portion 26 (surface on the other side thereof in the thickness direction).

This allows the protruding portions 16 to increase the physical strengths of the flying leads (conductive pattern 12) at the end edge portions of the base-side opening 18 via the left peripheral end portion 26 of the base-side opening 18 and reinforce the flying leads (conductive pattern 12). In such a case where, e.g., the first terminal portions 20 or the second terminal portions 21 and the external terminals (not shown) of the read/write board 40 are bonded together using ultrasonic vibration, when a force is applied to the conductive pattern 12 of the suspension board with circuit 1, a stress may be concentrated on the left end portions 23 of the external-side terminals 7 located over the protruding portions 16 to be concentrated on the flying leads at the end edge portion of the base-side opening 18. However, in that case also, it is possible to suppress such concentration of the stress.

As a result, it is possible to suppress the disconnection of the conductive pattern 12 at the end edge portion of the base-side opening 18 and consequently achieve an improvement in the connection reliability of the conductive pattern 12.

Therefore, it is possible to bond together the first terminal portions 20 or the second terminal portions 21 and the external terminals (not shown) using ultrasonic vibration without excessively increasing the output of the ultrasonic bonding device and suppress the disconnection of the flying lead (conductive pattern 12).

When each of the external-side terminals 7 is provided with a portion where the width thereof (longitudinal dimension of the suspension board with circuit 1) increases at the end edge portion of the base-side opening 18, the physical strength of the conductive pattern 12 at the end edge portion of the base-side opening 18 can be enhanced to reinforce the conductive pattern 12. However, when each of the external-side terminals 7 is provided with the wider portion, the spacing between the wider portions of the external-side terminals 7 adjacent to each other is reduced to possibly cause a short circuit between the external-side terminals 7 adjacent to each other. On the other hand, when the spacing between the external-side terminals 7 adjacent to each other is increased to suppress the short circuit therebetween, a problem arises in that the size of the suspension board with circuit 1 increases. Alternatively, when the width (longitudinal length) of each of the external-side terminals 7 is reduced to suppress the short circuit, a problem arises in that the exposed areas of the terminal portions (first terminal portions 20 and second terminal portions 21) of the plurality of external-side terminals 7 are reduced to degrade the reliability of connection with the external terminals (not shown).

By contrast, in the suspension board with circuit 1, it is possible to enhance the physical strengths of the flying leads (conductive pattern 12) at the end edge portions of the base-side opening 18 and reinforce the flying leads (conductive pattern 12) without providing the external-side terminals 7 with wider portions. This allows the short circuit between the external-side terminals 7 adjacent to each other to be suppressed without increasing the spacing between the external-side terminals 7 adjacent to each other and/or reducing the widths (longitudinal lengths) of the external-side terminals 7. Therefore, it is possible to achieve improvements in the physical strengths of the flying leads (conductive pattern 12) at the end edge portions of the base-side opening 18, while achieving a reduction in the size of the suspension board with circuit 1, and ensure the connection reliability between the terminal portions (first terminal portions 20 and second terminal portions 21) of the plurality of external-side terminals 7 and the external terminals (not shown).

In addition, since the protruding portions 16 protrude from the lateral end edges of the board-side opening 15 toward the interior of the board-side opening 15, the protruding portions 16 having a simple configuration can reliably reinforce the flying leads (conductive pattern 12) at the end edge portions of the base-side opening 18 via the peripheral end portion 19 of the base-side opening 18.

Next, a description will be given of second and third embodiments of the suspension board with circuit 1. Note that, in the second and third embodiments, the members corresponding to the individual parts described above are designated by the same reference numerals and a detailed description thereof is omitted.

In the foregoing first embodiment, each of the protruding portions 16 is formed in a generally arc shape in bottom view which protrudes from the lateral end edge of the board-side opening 15 toward the interior of the board-side opening 15. However, the shape of the protruding portion 16 is not particularly limited.

Figure 5A:
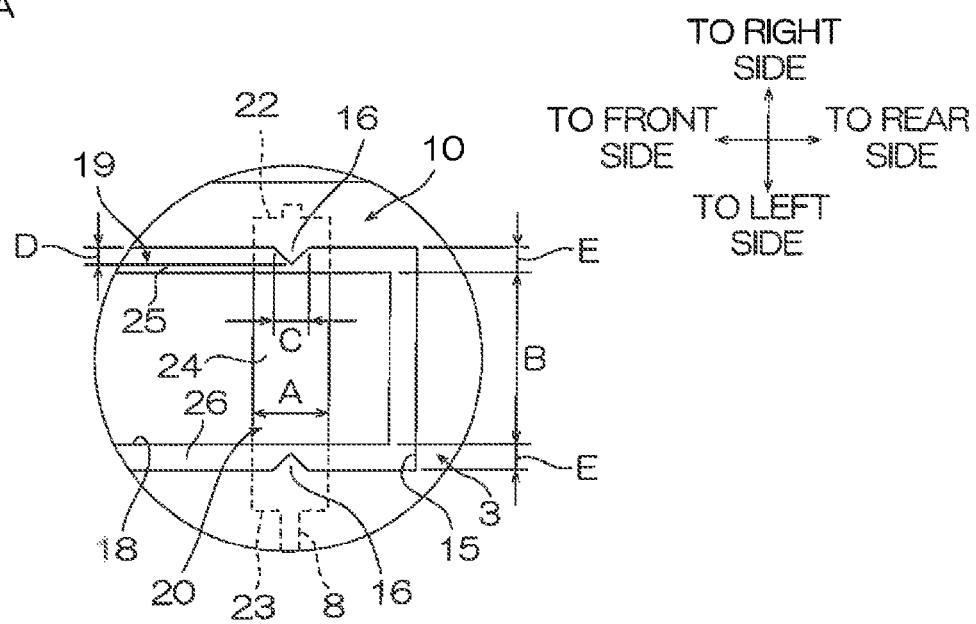
FIG. 5A is a bottom view of an external-side terminal according to a suspension board with circuit as a second embodiment of the wired circuit board of the present invention.
Figure 5B:
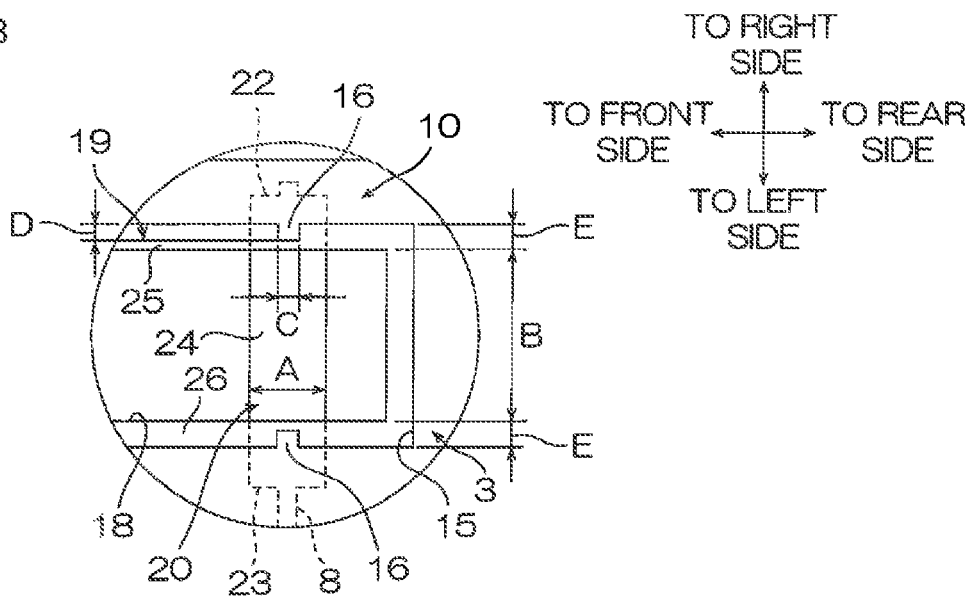
FIG. 5B is a bottom view of an external-side terminal according to a suspension board with circuit as a third embodiment of the wired circuit board of the present invention.

For example, in the second embodiment of the present invention, as shown in FIG. 5A, the protruding portions 16 are formed in generally triangular shapes in bottom view which protrude from the both lateral end edges of the board-side opening 15 toward the interior of the board-side opening 15. In the third embodiment of the present invention, as shown in FIG. 5B, each of the protruding portions 16 is formed in a generally rectangular shape in bottom view which protrudes from each of the both lateral end edges of the board-side opening 15 toward the interior of the board-side opening 15.

According to the second and third embodiments also, the same function/effect as achieved according to the foregoing first embodiment can be achieved.

Next, a description will be given of a fourth embodiment of the suspension board with circuit 1. Note that, in the fourth embodiment, the members corresponding to the individual parts described above are designated by the same reference numerals and a detailed description thereof is omitted.

In the first embodiment described above, as shown in FIG. 4I, the flying leads (first terminal portions 20 and second terminal portions 21) are each formed in a flat shape. However, in the fourth embodiment, as shown in FIG. 7H, the flying leads (first terminal portions 20 and second terminal portions 21) are each formed in a stepped shape.

Specifically, in each of the external-side terminals 7, a stepped portion 32 is formed so that a portion corresponding to the first terminal portion 20 and the second terminal portion 21, i.e., a generally middle portion in the lateral direction is lower in level than the other portions (right end portion 22 and left end portion 23). As a result, the second terminal portion 21 has a terminal depressed portion 34 formed to be downwardly depressed.

On the other hand, the insulating base layer 11 has extended portions 35 which are provided correspondingly to the stepped portion 32 of each of the external-side terminals 7. The extended portions 35 are formed so as to protrude laterally inwardly from the respective upper halves of the both lateral end edges of the base-side opening 18 toward the interior of the base-side opening 18.

Next, a producing method of the suspension board with circuit 1 as the fourth embodiment is described with reference to FIGS. 6A to 7H. Note that a description of the same portions as in the producing method of the suspension board with circuit 1 as the first embodiment (hereinafter referred to as the foregoing producing method) is omitted.

To produce the suspension board with circuit 1 as the fourth embodiment, as shown in FIGS. 6A and 6B, the supporting board 10 is prepared first (see FIG. 6A). Then, on the upper surface of the supporting board 10, the insulating base layer 11 having the base depressed portion 33 is formed (see FIG. 6B).

To form the insulating base layer 11 having the base depressed portion 33, e.g., a photosensitive base coating is formed in the same manner as in the foregoing producing method. Then, the photosensitive base coating is exposed to light via a gradation photomask not shown. The gradation photomask includes a light shielding portion, a light semi-transmitting portion, and a light full transmitting portion in a predetermined pattern. The light full transmitting portion is caused to face the portion of the base coating in which the insulating base layer 11 is formed. The light semi-transmitting portion is caused to face the portion of the base coating in which the base depressed portion 33 is formed. The light shielding portion is caused to face the portion of the base coating in which the insulating base layer 11 is not formed. Thereafter, the base coating is developed and cured to form the insulating base layer 11 having the base depressed portion 33.

Alternatively, to form the insulating base layer 11 having the base depressed portion 33, e.g., a solution (varnish) of the synthetic resin described above is uniformly applied to the entire upper surface of the supporting board 10, dried, cured, and then subjected to etching or the like to thus allow the base depressed portion 33 to be formed.

Then, on the upper surface of the insulating base layer 11 having the base depressed portion 33, as shown in FIG. 6C, the conductive pattern 12 is formed by the known patterning method mentioned above, or preferably by an additive method.

Thus, on the upper surface of the insulating base layer 11, the conductive pattern 12 including the plurality of head-side terminals 6, the plurality of external-side terminals 7, and the plurality of wires 8 is formed (see FIG. 1), and each of the external-side terminals 7 is formed with the stepped portion 32.

Then, as shown in FIGS. 7E and 7F, the insulating cover layer 13 having the cover-side opening 27 and the head-side opening (not shown) is formed on the upper surface of the insulating base layer 11 in the same manner as in the foregoing producing method. Consequently, the terminal depressed portion 34 of each of the second terminal portions 21 is exposed through the cover-side opening 27 of the insulating cover layer 13 to face upward.

Next, as shown in FIG. 7G, the supporting board 10 is partially removed by, e.g., the foregoing etching method, or preferably wet etching to form the supporting board 10 with the board-side opening 15 and the plurality of protruding portions 16.

Next, as shown in FIG. 7H, the base-side opening 18 is formed in the insulating base layer 11.

To form the base-side opening 18 in the insulating base layer 11, in the same manner as in the foregoing producing method, an etching resist (not shown) is placed. Then, the lower half (portion in which the base-side opening 18 is formed) of the insulating base layer 11 exposed from the etching resist (not shown) is removed by, e.g., the foregoing etching method, or preferably dry etching (e.g., plasma etching) until the first terminal portions 20 of the external-side terminals 7 are exposed so as to leave the extended portions 35 of the insulating base layer 11.

As a result, the base-side opening 18 is formed in the lower half of the insulating base layer 11, while the extended portions 35 are formed in the upper half of the insulating base layer 11. The extended portions 35 and the first terminal portions 20 are adjacent to each other in the lateral direction and the lower surfaces of the extended portions 35 and the first terminal portions 20 are formed generally flush.

Note that, in the fourth embodiment, as shown in FIG. 7H, the right peripheral end portion 25 and the left peripheral end portion 26 of the peripheral end portion 19 and the protruding portions 16 are formed such that the lateral dimension E of each of the right and left peripheral end portions 25 and 26 has generally the same length as that of the lateral dimension D of each of the protruding portions 16.

Then, as necessary, on the first terminal portions 20 and the second terminal portions 21, plating layers not shown are formed in the same manner as in the foregoing production method.

In this manner, the production of the suspension board with circuit 1 according to the fourth embodiment is completed.

According to the fourth embodiment also, the same function/effect as achieved according to the foregoing first embodiment can be achieved.

EXAMPLES

While in the following, the present invention is described more specifically with reference to Examples and Comparative Examples, the present invention is by no means limited thereto. Note that numerical values such as dimensions in Examples can be replaced by the upper limit values or lower limit values in the corresponding portions described in the foregoing first to fourth embodiments.

Example 1

A supporting board made of stainless steel, having a thickness of 18 µm and a flat belt shape, and extending in the front-rear direction was prepared (see FIG. 3A).

Then, to the upper surface of the supporting board, a solution (varnish) of a photosensitive polyimide resin precursor was applied and dried to form a photosensitive base coating. The photosensitive base coating was exposed to light via a photomask not shown. The photomask included a light shielding portion and a light full transmitting portion in a pattern. The light full transmitting portion was caused to face the portion of the base coating in which an insulating base layer was formed, while the light shielding portion was caused to face the portion of the base coating in which the insulating base layer was not formed. Then, the exposed base coating was developed and cured by heating to form the insulating base layer made of polyimide (see FIG. 3B). Note that the thickness of the insulating base layer was 10 µm.

Then, a chromium thin film having a thickness of 300 Å was formed by a sputter vapor deposition method on the upper surface of the insulating base layer. Then, a plating resist was formed in a pattern reverse to a conductive pattern (head-side terminals, external-side terminals, and wires) on the upper surface of the chromium thin film.

Then, by electrolytic copper plating, the conductive pattern (head-side terminals, external-side terminals, and wires) having a thickness of 10 µm was formed on the upper surface of the chromium thin film exposed from the plating resist (see FIG. 3C).

Note that, in Example 1, as shown in FIG. 2C and Table 1, the longitudinal dimension A (shown as Dimension A in Table 1) of each of the external-side terminals (first terminal portions) was 180 µm and the lateral dimension B (shown as Dimension B in Table 1) of the first terminal portion was 600 µm. The longitudinal spacing between the plurality of external-side terminals was 500 µm.

Then, the plating resist was removed by etching. Then, the chromium thin film exposed from the conductive pattern (head-side terminals, external-side terminals, and wires) was removed by wet etching.

Then, a solution (varnish) of a photosensitive polyimide resin precursor was applied to the upper surface of the insulating base layer including the conductive pattern to form a photosensitive cover coating (see FIG. 3D).

Thereafter, a photomask was placed to downwardly face the portion of the base coating in which a cover-side opening was formed and the portion of the base coating in which a head-side-terminal exposing opening (not shown) was formed so as to be spaced apart therefrom. The cover coating was exposed to light via the photomask (see FIG. 4E).

Then, the cover coating was developed and cured by heating to form an insulating cover layer made of polyimide and having the cover-side opening and the head-side-terminal exposing opening (not shown) on the upper surface of the insulating base layer (see FIG. 4F). The thickness of the insulating cover layer was 4 µm.

Then, the supporting board in the external connecting portion was partially removed by wet etching to form a board-side opening and a plurality of protruding portions (see FIG. 4G).

Note that each of the protruding portions was formed in a generally arc shape in bottom view which protrudes from the lateral end edge of the board-side opening toward the interior of the board-side opening.

Also, in Example 1, as shown in FIG. 2C and Table 1, the longitudinal dimension C (shown as Dimension C in Table 1) of each of the protruding portions was 140 µm and the lateral dimension D (shown as Dimension D in Table 1) of each of the protruding portions was 40 µm.

Then, on the lower surface of the insulating base layer exposed through the board-side opening, an etching resist was formed. The etching resist was placed along the end edges of the board-side opening and the plurality of protruding portions so as to surround the portion of the insulating base layer in which the base-side opening was formed when viewed from below.

Then, the insulating base layer (portion thereof in which the base-side opening was formed) exposed from the etching resist was removed by wet etching. Thereafter, the etching resist was removed (see FIG. 4H).

Thus, in the insulating base layer, the base-side opening was formed and the first terminal portions of the external-side terminals of the conductive pattern were exposed through the base-side opening to face downward. That is, of the first terminal portions and the second terminal portions, flying leads were formed.

On the other hand, the peripheral end portion of the base-side opening in the insulating base layer was exposed through the board-side opening to face downward (see FIG. 2B).

Note that, in Example 1, as shown in FIG. 2C and Table 1, the lateral dimension E (shown as Dimension E in Table 1) of each of the right peripheral end portion and the left peripheral end portion of the peripheral end portion of the base-side opening was 100 µm.

Then, by electrolytic nickel plating and electrolytic gold plating, a nickel plating layer having a thickness of 0.35 µm and a gold plating layer having a thickness of 2.5 µm were formed successively on each of the surfaces of the first terminal portions and the second terminal portions and the both surfaces of the external-side terminals continued thereto (see FIG. 4I).

In this manner, a suspension board with circuit was obtained (see FIG. 4I).

Example 2

A suspension board with circuit was obtained in accordance with the same method as in Example 1 except that, in each of the steps described above, as shown in Table 1, each of the protruding portions was formed to have the longitudinal dimension C of 40 µm and the lateral dimension D of 10 µm (see FIGS. 2C and 4I).

Example 3

A suspension board with circuit was obtained in accordance with the same method as in Example 1 except that, in each of the steps described above, as shown in Table 1, each of the external-side terminals (first terminal portions) was formed to have the longitudinal dimension A of 240 μm, each of the first terminal portions was formed to have the lateral dimension B of 480 μm, and each of the protruding portions was formed to have the lateral dimension D of 60 μm (see FIGS. 2C and 4I).

Example 4

A suspension board with circuit was obtained in accordance with the same method as in Example 1 except that, in each of the steps described above, as shown in Table 1, each of the external-side terminals (first terminal portions) was formed to have the longitudinal dimension A of 240 μm, each of the first terminal portions was formed to have the lateral dimension B of 480 μm, and each of the protruding portions was formed to have the longitudinal dimension C of 150 μm and the lateral dimension D of 10 μm (see FIGS. 2C and 4I).

Example 5

A suspension board with circuit was obtained in accordance with the same method as in Example 1 except that, in each of the steps described above, the protruding portions were formed to have generally triangular shapes in bottom view which protruded from the both lateral end edges of the board-side opening toward the interior of the board-side opening and, as shown in Table 1, each of the protruding portions was formed to have the longitudinal dimension C of 150 μm and the lateral dimension D of 45 μm (see FIG. 5A).

Example 6

A suspension board with circuit was obtained in accordance with the same method as in Example 1 except that, in each of the steps described above, the protruding portions were formed to have generally rectangular shapes in bottom view which protruded from the both lateral end edges of the board-side opening toward the interior of the board-side opening and, as shown in Table 1, each of the protruding portions was formed to have the longitudinal dimension C of 40 μm and the lateral dimension D of 40 μm (see FIG. 5B).

Comparative Example 1

A suspension board with circuit was obtained in accordance with the same method as in Example 1 except that, in each of the steps described above, the plurality of protruding portions were not formed.

Comparative Example 2

A suspension board with circuit was obtained in accordance with the same method as in Example 1 except that, in each of the steps described above, the plurality of protruding portions were not formed, each of the external-side terminals was formed to have the longitudinal dimension A of 240 μm, and each of the first terminal portions was formed to have the lateral dimension B of 480 μm.

Evaluation

In a state where the supporting boards of the suspension boards with circuits obtained in Examples 1 to 6 and Comparative Examples 1 and 2 were fixed, a given pressure (0.5 MPa) was applied to the entire lower surface of each of the supporting boards from a direction perpendicular to the supporting board and deformation (distortion) of the flying lead (first terminal portion and second terminal portion) thereof was visually checked. The results thereof are shown in Table 1.

Note that, when deformation was observed in the flying lead (first terminal portion and second terminal portion), the flying lead was evaluated to be "Poor" and, when no deformation was observed in the flying lead (first terminal portion and second terminal portion), the flying lead was evaluated to be "Good". The result of the evaluation is shown in Table 1.

TABLE 1

|  | Dimension A (μm) | Dimension B (μm) | Dimension C (μm) | Dimension D (μm) | Dimension E (μm) | Evaluation Based on Presence/Absence of Deformation |
|---|---|---|---|---|---|---|
| Example 1 | 180 | 600 | 140 | 40 | 100 | Good |
| Example 2 | 180 | 600 | 40 | 10 | 100 | Good |
| Example 3 | 240 | 480 | 140 | 60 | 100 | Good |
| Example 4 | 240 | 480 | 150 | 10 | 100 | Good |
| Example 5 | 180 | 600 | 150 | 45 | 100 | Good |
| Example 6 | 180 | 600 | 40 | 40 | 100 | Good |
| Comparative Example 1 | 180 | 600 | — | — | 100 | Poor |
| Comparative Example 2 | 240 | 480 | — | — | 100 | Poor |

While the illustrative embodiments of the present invention are provided in the above description, such is for illustrative purpose only and it is not to be construed limitative. Modification and variation of the present invention which will be obvious to those skilled in the art is to be covered by the following claims.

What is claimed is:
1. A wired circuit board, comprising:
a metal supporting layer;
a first insulating layer formed on a surface on one side of the metal supporting layer in a thickness direction thereof;
a conductive pattern formed on a surface on one side of the first insulating layer in the thickness direction; and
a second insulating layer formed on a surface on one side of the conductive pattern in the thickness direction, wherein
the first insulating layer includes a first opening which exposes a surface on the other side of the conductive pattern in the thickness direction from the first insulating layer,
the second insulating layer includes a second opening which exposes the surface on one side of the conductive pattern in the thickness direction from the second insu- lating layer and is located such that at least one part thereof overlaps the first opening when projected in the thickness direction, the conductive pattern has the surface on the other side thereof in the thickness direction which is exposed through the first opening and configured as a first terminal portion, and the surface on one side thereof in the thickness direction which is exposed through the second opening and configured as a second terminal portion, and the metal supporting layer includes a third opening which exposes the first terminal portion and a covering portion of the first insulating layer which covers the conductive pattern continued to the first terminal portion, and a reinforcing portion located on a surface on the other side of the covering portion in the thickness direction and provided continuously from the metal supporting layer, wherein the reinforcing portion is a protruding portion which protrudes from an end edge of the third opening toward an interior of the third opening.

2. A wired circuit board according to claim 1, wherein the protruding portion is formed in a generally arc shape in a plan view.

3. A wired circuit board according to claim 1, wherein the protruding portion is formed in a generally triangular shape in a plan view.

4. A wired circuit board according to claim 1, wherein the protruding portion is formed in a generally rectangular shape in a plan view.

* * * * *